United States Patent [19]

Pan et al.

[11] 4,245,193
[45] Jan. 13, 1981

[54] HIGH-Q MULTI-MODE RESONATOR CONTROLLED SOURCE

[75] Inventors: Jing-Jong Pan; Milton P. Arnold, both of Melbourne, Fla.

[73] Assignee: Harris Corporation, Cleveland, Ohio

[21] Appl. No.: 932,303

[22] Filed: Aug. 9, 1978

[51] Int. Cl.[2] .................. H03B 3/04; H03B 5/30; H03B 21/02
[52] U.S. Cl. ............................ 331/39; 331/41; 331/107 A
[58] Field of Search ................ 331/107 A, 37, 38, 39, 331/41, 42, 43; 333/30 R, 72

[56] References Cited

U.S. PATENT DOCUMENTS 3,855,548  12/1974  Nandi et al. .................. 331/107 A Primary Examiner—Siegfried H. Grimm
Assistant Examiner—Edward P. Westin
Attorney, Agent, or Firm—Craig & Antonelli

[57] ABSTRACT

An oscillation control circuit in which the output of an unstabilized oscillator is controlled using a bulk acoustic wave resonator. The circuit includes a high and low frequency loop with the power output of the oscillator being divided and supplied along respective paths to the high and low frequency portions of the loop. The high frequency portion of the loop, which includes the BAW resonator, operates at the output frequency $f_0$, which is equal to the sum of the oscillator frequency $f_1$ and the frequency $f_2$ of the low frequency portion of the loop. A first mixer receives the frequencies $f_0$ and $f_1$ and produces an output $f_2$ in the low frequency portion of the loop, while a second mixer receives the frequencies $f_1$ and $f_2$ and produces an output $f_0$ in the high frequency portion of the loop. In this way, as the oscillator output frequency $f_1$ varies, the frequency $f_2$ in the low portion of the frequency loop varies inversely, so that the up-down conversion performed by the system maintains $f_0$ constant.

14 Claims, 2 Drawing Figures

HIGH-Q MULTI-MODE RESONATOR CONTROLLED SOURCE

The present invention relates in general to acoustic wave devices, and more particularly to an oscillation control circuit for a bulk acoustic wave resonator which obviates the frequency mode jumping and ambiguity of frequency oscillation selection inherent to bulk acoustic wave resonators.

In recent years, many microwave techniques, such as space-tracking communications, phase, frequency and velocity measurements, electron paramagnetic resonance spectroscopy, radar cross-section measurements, as well as coherent radar have evolved which require a highly stabilized oscillator with extremely low noise. Low noise performance of an oscillator requires either a high-Q circuit or a phase-locked design. Also, according to experimental results, it has been found that a resonator-controlled source can provide excellent frequency stability. All crystal, surface acoustic wave (SAW), bulk acoustic wave (BAW), inductance-capacitance (LC) and cavity resonators can be utilized to stabilize and control the oscillator.

Crystal and inductance-capacitance resonators have a low operation frequency and high instability due to mechanical vibration or jittering. Cavity resonators normally have a large physical size and multiple electro-magnetic modes with different field distributions. On the other hand, both surface acoustic wave and bulk acoustic wave resonators have the advantages of miniature size, simplicity of construction, high reproducibility and immunity to mechanical vibration. The surface acoustic wave resonators are currently fabricated in VHF and UHF ranges by conventional photolithography technics. For high frequency fabrication, the high resolution mask-maker, such as electron-beam or ion-beam lithography, must be employed.

However, because of the physical size of the transducers associated therewith, the surface acoustic wave resonator may reach its frequency limitation at 2 GHz. In contrast, without the need for precision masks, the bulk acoustic wave resonator can be fabricated up to 18 GHz at lower manufacturing cost. Unfortunately, the bulk acoustic wave composite resonator can support a train of discrete modes with frequency separation between adjacent modes equal to V/2L, where V is the acoustic propagation velocity and L is the length of the bulk acoustic wave resonator. Normally, the frequency separation is small in such devices, but this disadvantage can be serious for some applications.

It is therefore an object of the present invention to provide a high-Q multi-mode resonator controlled source employing a bulk acoustic wave resonator which obviates frequency mode jumping and the ambiguity of frequency oscillation selection.

It is another object of the present invention to provide an oscillation control circuit having a highly stabilized output frequency with extremely low noise.

It is a further object of the present invention to provide a circuit of the type described which is simple and inexpensive to manufacture and is capable of operating at frequencies up to 18 GHz.

The present invention provides a circuit which includes an unstabilized oscillator source oscillating at a frequency $f_1$ and two power division paths; one for up-converting and one for down-converting the frequency $f_1$ provided by the oscillator source. The low frequency portion of the loop centers at a frequency $f_2$ and satisfies the condition $f_d \neq 2mf_2$, where $f_d$ is a bulk acoustic wave resonator mode spacing frequency and m is an integer. The frequency $f_1$ from the oscillator is mixed in a first mixer with the frequency $f_2$ from the low frequency portion of the loop to obtain an output $f_1 + f_2$ which is applied to the bulk acoustic wave resonator. The resonator is designed to oscillate at a frequency $f_0 = f_1 + f_2$, the frequency $f_0$ being the stabilized frequency to be provided at the output of the oscillator system. Thus, the output $f_0$ from the bulk acoustic wave resonator is applied to a directional coupler output to provide the output from the circuit and is also provided to one input of a second mixer. The frequency $f_1$ is applied to the second input of the second mixer such that a signal $f_0 - f_1$ is obtained at the output of the second mixer. This output signal is, in turn, applied as the second input to the first mixer.

With the circuit in accordance with the present invention, when the frequency $f_1$ from the oscillator begins to rise, then the frequency $f_2$ at the output of the second mixer decreases proportionally to compensate for this rise in the oscillator frequency. A similar compensation is obtained when the frequency $f_1$ begins to decrease. Thus, this circuit permits the very precise control of the frequency $f_1 + f_2$ applied to the bulk acoustic wave resonator while permitting the use of a low-cost non-stable oscillator as the source.

These and other objects, features and advantages of the present invention will become more apparent from the following detailed discription of the present invention, when taken in conjunction with the accompanying drawings which illustrate an exemplary embodiment thereof.

Figure 1A:
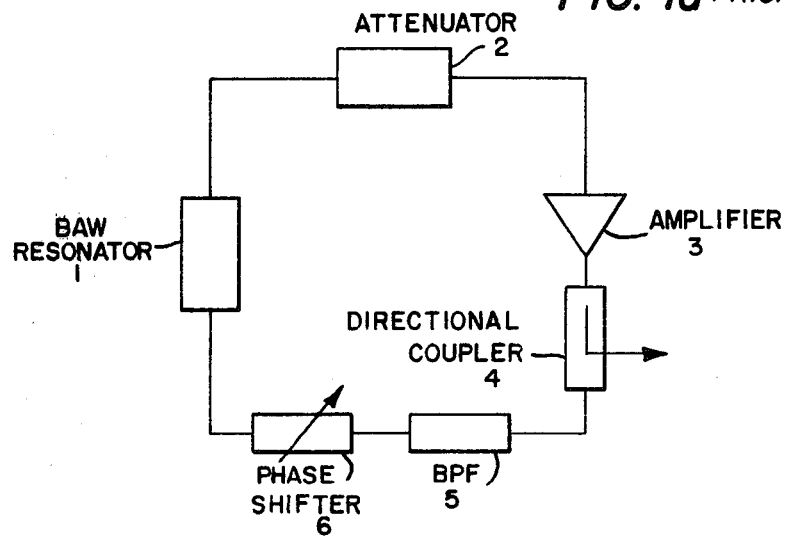
FIG. 1a is a schematic diagram of a conventional bulk acoustic wave resonator controlled oscillator of the feedback configuration.
Figure 1B:
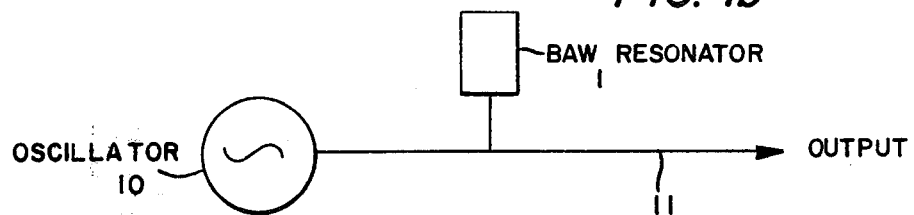
FIG. 1b is a schematic circuit diagram of a conventional transmission bulk acoustic wave resonator controlled oscillator.
Figure 1C:
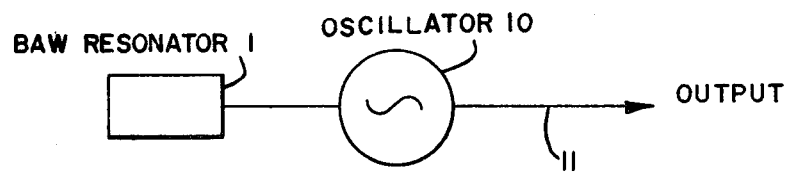
FIG. 1c is a schematic circuit diagram of a conventional reflection bulk acoustic wave resonator controlled oscillator.

Conventionally, the bulk acoustic wave resonator controlled oscillator is constructed in one of three configurations, as depicted in FIGS. 1a, 1b, and 1c. FIG. 1a an oscillator circuit of the feedback type, in which the total feedback loop length must fulfill the condition $2n\pi$ with n being an integer. The resonator 1 is connected through an attenuator 2 and an amplifier 3 to a directional coupler 4, which couples the signal of the desired frequency to the output of the circuit. The directional coupler 4 also provides a signal out through a band pass filter 5 and a variable phase shifter 6, forming a feed back path, to the resonator 1. In this arrangement, the band pass filter 5, amplifier 3 and attenuator 2 are selected to generate a total loop gain G1 which is greater than one for the desired mode and less than one for all other modes generated within the circuit. However, with this type of signal generating circuit, is is very difficult in practice to implement the system to operate at an accurate frequency since the bulk acoustic wave resonator mode spacing is so small. As a result, frequency jumping sometimes is unavoidable. Besides, this scheme is not electronically tuneable except by using a tuneable band pass filter.

FIGS. 1b and 1c represent the transmission and reflection resonator controlled oscillator approaches, respectively, typical of the prior art. In the circuit of FIG. 1b, an oscillator 10 is connected to an output line 11 to which is also connected the bulk acoustic wave resonator 1. In the circuit of FIG. 1c, the oscillator 10 is connected to the output line 11 and the bulk acoustic wave resonator 1 is connected to the oscillator 10 but not to the output transmission line 10. In addition to the disadvantages of the feedback approach, the phase relationship between the oscillator and the resonator is extremely critical for these two approaches. In addition, precision design and operation exercise are required.

Figure 2:
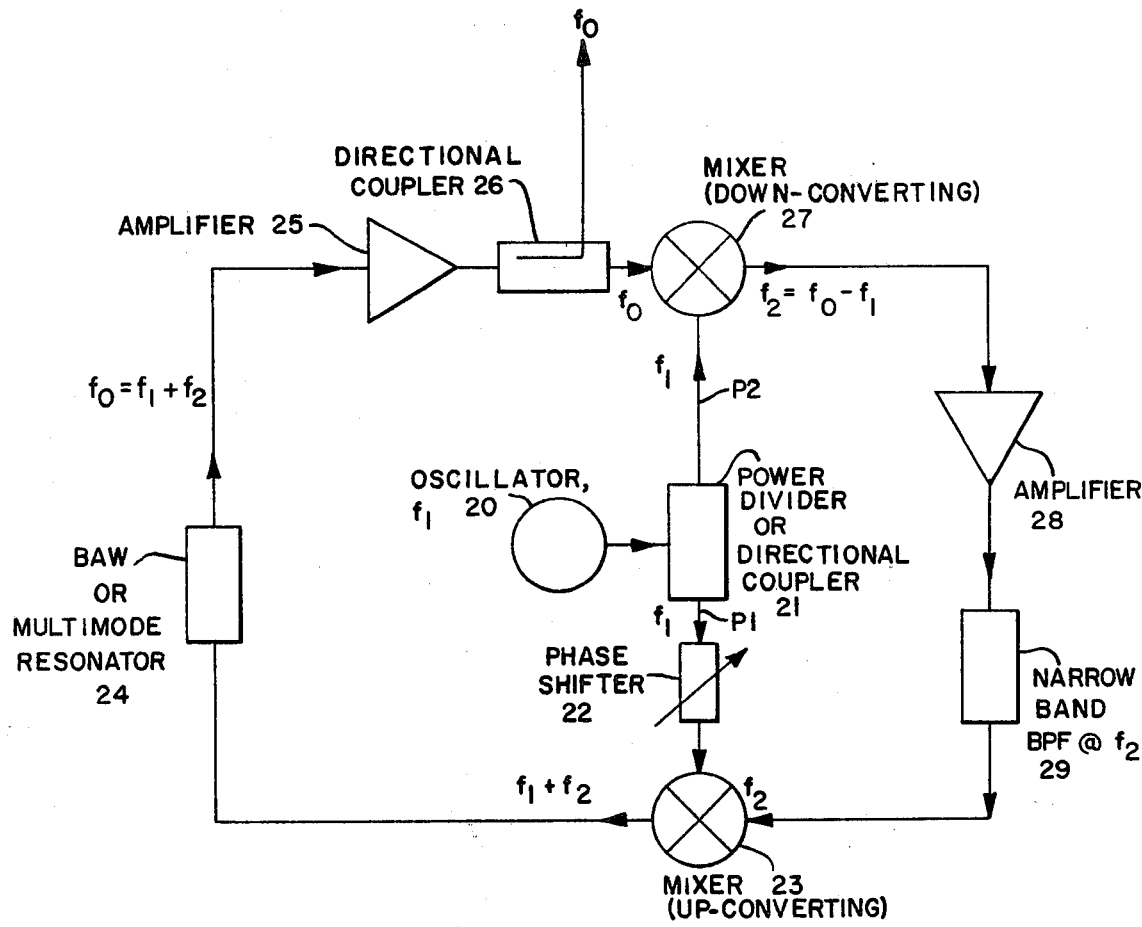
FIG. 2 is a schematic circuit diagram of a bulk acoustic wave resonator controlled oscillator in accordance with the present invention.

The present invention, as depicted in FIG. 2, serves to avoid the frequency (mode) jumping and the ambiguity of selecting oscillation frequency, which are inherent characteristics of the prior art circuit. The unstablized source oscillator 20 provides an output at frequency $f_1$ to a power divider 21 which divides the power into two paths, one path P1 for up-converting and one path P2 for down-converting the output frequency of the oscillator 20. The path P1 includes a phase shifter 22 which is connected to the output of the power divider 21 and serves to shift the phase of the signal $f_1$ which is applied to one input of a mixer 23. The output of the mixer 23 is connected to a bulk acoustic wave or multi-mode resonator 24 which is connected in turn through amplifier 25 to a directional coupler 26. The directional coupler 26 provides an output at frequency $f_0$, which forms the output for the oscillator circuit, and also provides an output to one input of a second mixer 27. The other input of the mixer 27 is connected to the path P2 extending from the power divider 21. The output of the mixer 27, on the other hand, is connected through an amplifier 28 and a narrow band pass filter 29 to a second input of the mixer 23.

The frequency $f_1$ of the oscillator 20 is selected with respect to the desired output frequency $f_0$ of the system so that $f_0$ is equal to $f_1$ plus a second frequency $f_2$. In this regard, the frequency $f_1$ and $f_2$ must be selected at frequencies at which the value $f_1 + f_2$ is in the operating range of the bulk acoustic wave resonator 24. The low frequency portion of the loop, which includes the amplifier 28 and the narrow band pass filter 29, centers at frequency $f_2$ and satisfies the condition $f_d \neq 2mf_2$, where $f_d$ is the bulk acoustic wave resonator mode spacing frequency and m is an integer. In this regard, if $f_d$ equals $2mf_2$, then the output of the system will contain two components at $f_0 = f_1 \pm f_2$. Thus, $f_d$ must be selected at a value which does not equal two times $f_2$ or an integral multiple thereof.

The oscillator 20 provides an output at frequency $f_1$ which is supplied along the second path P2 to the mixer 27 which performs a down converting operation with respect to the output signal of the system at frequency $f_0$, applied to the second input of the mixer. As a result, the output of mixer 27 will be equal to $f_0 - f_1$, which is the frequency $f_2$. This signal is amplified by the amplifier 28 and applied through the narrow band pass filter 29, which is centered at the frequency $f_2$, to an input of mixer 23. The other input of mixer 23 receives the signal at frequency $f_1$ from the oscillator 20 by way of the power divider 21 and the phase shifter 22, so that the output of mixer 23 will be equal to $f_1 + f_2$. Thus, the mixer 23 will apply to the bulk acoustic wave or multi-mode resonator 24 a signal $f_1 + f_2$ to control the frequency of oscillation of the resonator at the desired frequency $f_0$.

In operation, when the frequency $f_1$ from the oscillator 20 begins to rise, the frequency $f_2$ provided at the output of mixer 27 decreases proportionally to compensate therefore. In other words, the frequency $f_2$ which is then supplied through amplifier 28 and narrow band filter 29 to the input of mixer 23 will be reduced so that the output of mixer 23 will remain constant in spite of the increase in the frequency of the oscillator $f_1$. Similarly, if the frequency $f_1$ provided by the oscillator 20 begins to decrease, the frequency $f_2$ provided at the output of the mixer 27 increases proportionally to compensate therefore. Thus, the frequency $f_2$ provided through the amplifier 28 and the narrow band pass filter 29 to the mixer 23 will remain constant at a value equal to $f_1 + f_2$. Thus, the circuit in accordance with the present invention provides for compensation of increases and decreases in the frequency of the oscillator 20, which is an unstablized oscillator, by providing an up-down conversion of the second frequency $f_2$ to produce an output frequency $f_0$ which remains substantially constant irrespective of the changes of the frequency output of the oscillator 20.

The purpose of the narrow band pass filter 29 in the low frequency portion of the loop is to eliminate undesired spurs precisely determining the frequency $f_2$ and to fulfill the operation condition of $f_d$ being larger than the band width of the $f_2$ filter. The mixers 23 and 27 and the amplifiers 25 and 28 should be of the low noise type in order to obtain low noise performance of the circuit. Most or all of the signal gain could be obtained in amplifier 28 thereby reducing or illiminating the need for amplifier 25. There are four noise sources within the system; namely, the mixer 23 and 27, the high frequency amplifier 25, the amplifier 28 and the unstabilized oscillator 20. If the balanced mixers are used, the noise from the oscillator 20 can be canceled by judicious adjustment of phase shifter 22 and will present no specific problem. The noise contribution from the mixers 23 and 27 and the amplifier 28 can be approximately expressed as:

$$N_d \simeq \sqrt{E_{nd}^2 + E_n^2 + I_n^2 R_m^2} \tag{1}$$

where, $E_{nd}$ is the mixer noise, $E_n$ and $I_n$ are uncorrelated amplifier noise generators, and $R_m$ is the video impedance of the mixers.

The phase noise spectrum $S\phi$ contributed by the high frequency portion of the loop is approximately $$S\phi(f) = \left[\frac{\alpha}{f_m} + \frac{2FkT}{P_s}\right]\left[1 + \left(\frac{f_o}{2Qf_m}\right)^2\right] \tag{2}$$

where $\alpha$ is a constant dependent upon the choice of amplifier 25, F is the noise figure of the amplifier 25, k is Boltzmann's constant, $P_s$ is the lower level at the input of amplifier 25, and $f_m$ is the frequency offset from the carrier.

Comparing the noise contribution of the mixers 23 and 27 with that of the amplifier 28, the former may have 6-10 db higher than the latter. Therefore, the noise performance of the mixers is the dominant factor in the system. However, the narrow band filter 29 following the video amplifier 28 reduces the sideband noise spectral density considerably.

In order to satisfy the conditions for single mode operation, the bandwidth B of the bandpass filter 29 should be less than the mode spacing $f_d$. Also, the combined frequency uncertainty of the oscillation 20 at frequency $f_1$ and the multi-mode resonator 24 should be less than B/2. Thus, the condition on the oscillator frequency uncertainty $\delta f_1$ (or the equivalent multi-mode resonator frequency uncertainty) may be expressed as:

$$\delta f_1 < B/2 < f_d/2 \qquad (3)$$

Ideally, the bandwidth B could be almost equal to $f_d$, but as a practical matter it will probably be substantially less and $\delta f_1$ will have to be a small fraction (for example 10%) of the mode spacing $f_d$.

While the invention has been particularly shown and described with reference to a preferred embodiment thereof, it will be understood by those skilled in the art that the invention is subject to various changes in form and details without departing from the spirit and scope of the invention as defined by the appended claims.

What is claimed is:

1. An oscillation control circuit for providing an output signal at a constant predetermined frequency, comprising:
    an unregulated oscillator providing an output at a first frequency;
    a loop including high and low frequency portions;
    said high frequency portion of the loop including a multimode resonator for generating said output signal at said constant predetermined frequency;
    said low frequency portion of the loop including frequency down-converting means coupled to said high frequency portion of the loop and said oscillator for generating a signal at a second frequency selected to be equal to the difference between said predetermined output frequency and said first frequency; and
    frequency up-converting means responsive to the output of said oscillator and the output of said low frequency portion of the loop for applying to said resonator a signal having a frequency equal to the sum of said first and second frequencies.

2. An oscillator control circuit as defined in claim 1 wherein said low frequency portion of the loop includes a narrow band pass filter centered at said second frequency.

3. An oscillator control circuit as defined in claim 2 wherein said band pass filter has a bandwidth which is smaller than the mode frequency spacing of said multimode resonator.

4. An oscillator control circuit as defined in claim 1 wherein said multimode resonator is a bulk acoustic wave resonator.

5. An oscillator control circuit as defined in claim 1 wherein said frequency down-converting means comprises a first mixer providing an output having a frequency equal to the difference between said predetermined frequency and the frequency of the output of said oscillator and said low frequency portion of the loop further includes a narrow band pass filter and amplifier connected to the output of said first mixer and having a pass band centered at said second frequency.

6. An oscillator control circuit as defined in claim 5 wherein said band pass filter has a band width which is smaller than the mode frequency spacing of said multimode resonator.

7. An oscillator control circuit as defined in claim 5 wherein said frequency up-converting means comprises a second mixer having inputs connected to receive the outputs of said narrow band pass filter and said oscillator, respectively, and an output connected to said multimode resonator.

8. An oscillator control circuit as defined in claim 7, further including power divider means connected to said oscillator for dividing the output of said oscillator into two paths, one path extending to said first mixer and a second path extending to said second mixer.

9. An oscillator control circuit as defined in claim 8 wherein said multi-mode resonator is a bulk acoustic wave resonator.

10. An oscillator control circuit as defined in claim 8 wherein a variable phase shifter is connected in said second path.

11. An oscillator control circuit for providing an output signal at a constant predetermined frequency, comprising
    an unregulated oscillator providing an output at a first frequency;
    a first mixer having first and second inputs and an output, said second input being connected to receive the output of said oscillator;
    a second mixer having first and second inputs and an output, said first input being connected to receive the output of said oscillator;
    a narrow band pass filter connected between the output of said first mixer and said second input of said second mixer, said filter having its pass band centered at a frequency selected to be equal to the difference between said predetermined frequency and said first frequency;
    a multimode resonator connected between the output of said second mixer and said first input of said first mixer; and
    means connected to said resonator for providing an output at said predetermined frequency.

12. An oscillator control circuit as defined in claim 11, wherein said band pass filter has a bandwidth which is smaller than the mode frequency spacing of said multimode resonator.

13. An oscillator control circuit as defined in claim 12 wherein said multimode resonator is a bulk acoustic wave resonator.

14. An oscillator control circuit as defined in claim 13, further including power divider means connected to the output of said oscillator for applying the oscillator output to said first and second mixers.

* * * * *